(12) United States Patent
Mizan et al.

(10) Patent No.: US 10,218,346 B1
(45) Date of Patent: Feb. 26, 2019

(54) HIGH CURRENT LATERAL GAN TRANSISTORS WITH SCALABLE TOPOLOGY AND GATE DRIVE PHASE EQUALIZATION

(71) Applicant: GaN Systems Inc., Ottawa (CA)

(72) Inventors: Ahmad Mizan, Kanata (CA); Greg P. Klowak, Ottawa (CA); Xiaodong Cui, Nepean (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/704,458

(22) Filed: Sep. 14, 2017

(51) Int. Cl.
| | |
|---|---|
| *H01L 29/20* | (2006.01) |
| *H01L 23/522* | (2006.01) |
| *H01L 29/778* | (2006.01) |
| *H03K 17/081* | (2006.01) |
| *H01L 29/205* | (2006.01) |
| *H01L 23/528* | (2006.01) |
| *H01L 29/06* | (2006.01) |
| *H01L 23/532* | (2006.01) |
| *H01L 23/31* | (2006.01) |

(52) U.S. Cl.
CPC ... *H03K 17/08104* (2013.01); *H01L 23/5227* (2013.01); *H01L 23/5283* (2013.01); *H01L 23/5286* (2013.01); *H01L 29/0696* (2013.01); *H01L 29/2003* (2013.01); *H01L 29/205* (2013.01); *H01L 29/7787* (2013.01); *H01L 23/3171* (2013.01); *H01L 23/53228* (2013.01)

(58) Field of Classification Search
CPC ......... H01L 29/66431; H01L 29/66462; H01L 29/778–29/7789; H01L 29/2003; H01L 29/201; H01L 29/205; H01L 29/0692; H01L 29/0696; H01L 2924/13064; H01L 23/5227; H01L 23/645; H01L 23/528–23/5286; H01L 27/0203; H01L 27/0207

See application file for complete search history.

(56) References Cited

U.S. PATENT DOCUMENTS

| | | | |
|---|---|---|---|
| 7,550,821 B2 * | 6/2009 | Shibata | ............... H01L 24/05 257/615 |
| 8,791,508 B2 | 7/2014 | Roberts et al. | |
| 9,029,866 B2 | 5/2015 | Roberts et al. | |

(Continued)

*Primary Examiner* — Marc Armand
*Assistant Examiner* — Younes Boulghassoul
(74) *Attorney, Agent, or Firm* — Miltons IP/p.i.

(57) ABSTRACT

Large area, high current, lateral GaN power transistors are implemented using an on-chip interconnect topology wherein the transistor is arranged as an array of sections, each section comprising a set of transistor islands; gate and source buses that form each gate drive loop have substantially the same track widths; the source bus runs over or under the gate bus, and the tracks are inductively coupled to provide flux cancellation in the gate drive loop, thereby reducing parasitic inductances. The gate delay in each gate drive loop is reduced, minimizing the gate drive phase difference across the transistor. An overlying current redistribution layer preferably has a track width no greater than that of the underlying source and drain buses, for efficient coupling. This topology provides improved scalability, enabling fabrication of multi-section, large scale, high current lateral GaN transistors with reduced gate drive loop inductance, for improved operational stability.

20 Claims, 13 Drawing Sheets

(56) References Cited

U.S. PATENT DOCUMENTS

| | | |
|---|---|---|
| 9,064,947 B2 | 6/2015 | Roberts et al. |
| 9,153,509 B2 | 10/2015 | Klowak et al. |
| 9,324,819 B1 * | 4/2016 | Lin .................... H01L 23/4824 |
| 9,508,797 B2 | 11/2016 | Roberts et al. |
| 9,589,868 B2 | 3/2017 | Mcknight-Macneil et al. |
| 9,589,869 B2 | 3/2017 | Mcknight-Macneil et al. |
| 9,659,854 B2 * | 5/2017 | Klowak ............. H01L 23/4824 |
| 9,660,639 B2 | 5/2017 | Roberts et al. |
| 2006/0081985 A1 * | 4/2006 | Beach ................ H01L 29/0692 |
| | | 257/745 |
| 2016/0322487 A1 * | 11/2016 | Nogami ............. H01L 29/8124 |
| 2017/0077276 A1 * | 3/2017 | Suzuki ................ H01L 29/778 |

* cited by examiner $$dt = \frac{L}{V} di$$

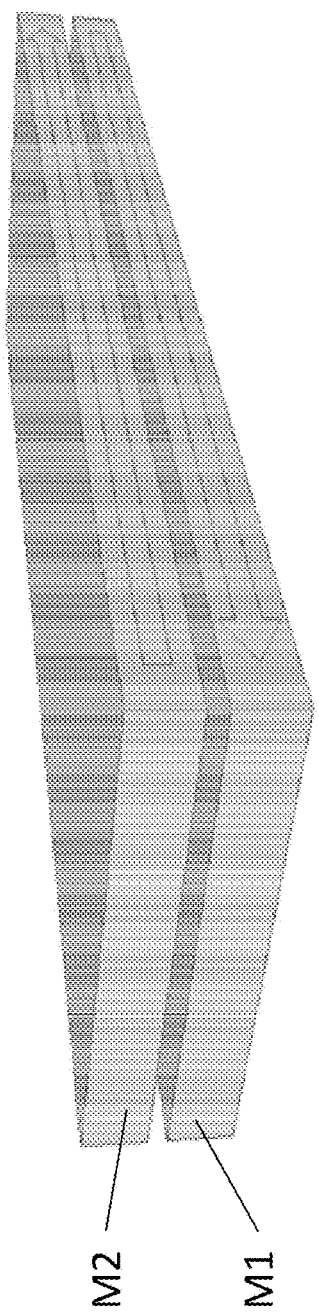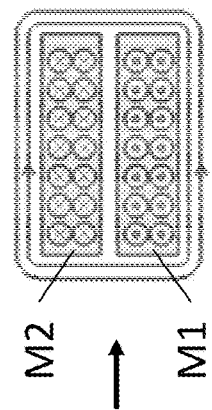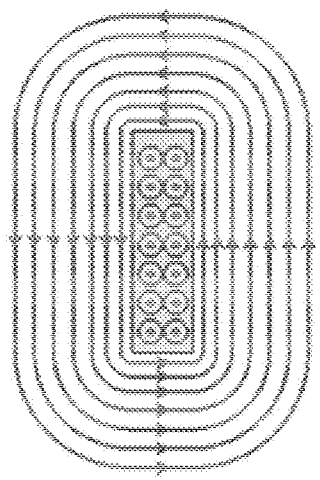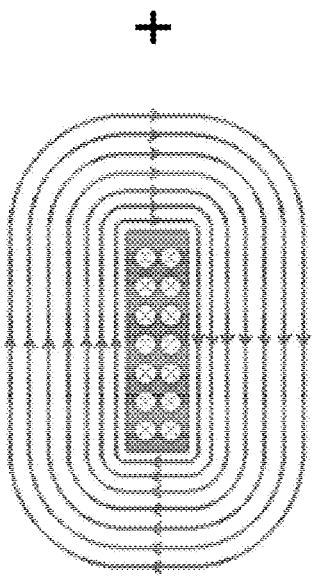
Fig. 5
Fig. 6

Under-damped circuit waveform

Over-damped circuit waveform

Critically-damped circuit waveform

HIGH CURRENT LATERAL GAN TRANSISTORS WITH SCALABLE TOPOLOGY AND GATE DRIVE PHASE EQUALIZATION

CROSS-REFERENCE TO RELATED APPLICATION(S)

N/A

TECHNICAL FIELD

This invention relates to devices and systems comprising high current lateral gallium nitride (GaN) transistors, such as GaN power switches; it relates particularly to gate drive phase equalization and current redistribution for GaN High Electron Mobility Transistors (GaN HEMTs).

BACKGROUND ART

Large area, lateral GaN transistors for high voltage/high current operation, such as GaN power switches comprising GaN E-HEMTs, may comprise a plurality of transistor elements connected in parallel. For example, the topology of a large area, large gate width GaN E-HEMT may comprise a plurality of transistor elements in the form of islands which are interconnected in parallel. Each island comprises individual source, drain and gate electrodes and a plurality of islands are interconnected to form a multi-island transistor. Various topologies are known for large area transistors. Examples having an overlying interconnect structure comprising a source bus, a drain bus and a gate bus, which interconnect respective source, drain and gate electrodes of each island, are described in the Applicant's earlier filed patent applications.

For example, U.S. patent application Ser. No. 14/568,507, filed Dec. 12, 2014, now U.S. Pat. No. 9,153,509, entitled "Fault Tolerant Design for Large Area Nitride Semiconductor Devices" discloses a large area lateral transistor comprising a two-dimensional array a plurality of islands or cells, e.g. arranged as rows and columns. Each island comprises a source electrode, drain electrode and gate electrode. For each group or set of islands, e.g. a column of islands, source electrodes of individual islands are connected in parallel by a source strap (source bus); drain electrodes of individual islands are interconnected in parallel by a drain strap (drain bus); and gate electrodes of individual islands are interconnected by a gate strap (gate bus) to provide a transistor with a very large gate width, Wg.

Examples of other device topologies, interconnect arrangements and packaging solutions for lateral GaN power transistors are disclosed in:

U.S. patent application Ser. No. 15/091,867, filed Apr. 6, 2016, now U.S. Pat. No. 9,660,639, entitled "Distributed Driver Circuitry integrated with GaN Power Transistors";

U.S. patent application Ser. No. 15/027,012, filed Apr. 15, 2015, now U.S. Pat. No. 9,659,854, entitled "Embedded Packaging for Devices and Systems Comprising Lateral GaN Power Transistors";

U.S. patent application Ser. No. 15/064,750, filed Mar. 9, 2016, now U.S. Pat. No. 9,589,868, entitled "Packaging Solutions for Devices and Systems Comprising Lateral GaN Power Transistors";

U.S. patent application Ser. No. 15/064,955, filed Mar. 9, 2016, now U.S. Pat. No. 9,589,869, entitled "Packaging Solutions for Devices and Systems Comprising Lateral GaN Power Transistors";

U.S. patent application Ser. No. 14/681,676, filed Apr. 8, 2015, now U.S. Pat. No. 9,508,797, entitled "Gallium Nitride Power Devices using Island Topography";

U.S. Pat. No. 1,020,712, filed Feb. 3, 2011, now U.S. Pat. No. 9,029,866, entitled "Gallium Nitride Power Devices using Island Topography";

U.S. patent application Ser. No. 13/641,003, filed Apr. 13, 2011, now U.S. Pat. No. 8,791,508 entitled "High Density Gallium Nitride Devices using Island Topology"; and U.S. patent application Ser. No. 13/388,694, filed Aug. 4, 2010, now U.S. Pat. No. 9,064,947 entitled "Island Matrixed Gallium Nitride Microwave and Power Switching Transistors".

All these patents and applications are incorporated herein by reference in their entirety.

In large area GaN transistors, for example, a device having an area of ~1 $cm^2$ or more, i.e. a die size of about 10 mm×10 mm, the length of on-chip wiring or interconnect tracks extending between the gate driver circuitry and gate electrodes of a large area GaN transistor can introduce significant parasitic on-chip inductances. Unbalanced gate inductances may lead to unbalanced and unstable operation, and hence, poor performance.

For example, as discussed in the above referenced U.S. Pat. No. 9,660,639, entitled "Distributed Driver Circuitry Integrated with GaN Power Transistors", a large area GaN transistor may be partitioned into sections, and each section is interconnected to the gate driver circuit by differing lengths of source and gate interconnections. This arrangement introduces different amounts of parasitic inductance, i.e. inductances dependent on the lengths of on-chip wiring or interconnect. For high speed switching, it is desirable to have coherent synchronous turn-on/turn-off across all transistor sections of a large area multi-section GaN transistor.

Another consideration is that, when multiple GaN transistors are interconnected, or when multiple GaN transistor elements or sections of large area devices are connected in parallel, they are prone to current imbalance due to differences in parasitic resistances/inductances resulting from differing lengths of interconnect metallization for the gate drive signals.

GaN transistors are positive temperature coefficient (PTC) elements, and are self-heating during conduction. GaN transistors connected in parallel balance their currents during conduction time due to self-heating. Current imbalance is likely to occur during the turn-on rise time of switching transistors, due to lack of resistance balance. Parallel transistor cells on the same substrate balance their resistances during steady state operation. However, on a cold start, during turn-on, the resistances of different transistor cells are not the same, due to fabrication imperfections in large scale GaN transistors. Therefore, it is necessary to use a different mechanism to ensure that the transistor cells share their current during their rise time period.

One way to minimize the overall current imbalance regime is to minimize rise time, and particularly the gate plateau regime, by reducing gate resistance. However, reducing gate resistance adds to transistor gain and increases the likelihood of oscillations at the gate pin. Increasing gate resistance adds to switching losses and reduces the efficiency of the transistor.

Alternative solutions are needed to protect large scale and high current lateral GaN power transistors against potential damage associated with rise time current imbalances and differing delays during the turn-on state.

SUMMARY OF INVENTION

The present invention seeks to provide improved performance in devices and systems comprising GaN power transistors, particularly large area, high current lateral GaN power transistors, by balancing switching times of parallel transistor elements.

Aspects of the invention provide device topologies for large area, high current lateral GaN power transistors wherein the transistor comprises an array of a plurality of transistor sections forming a multi-section transistor, wherein the transistor sections are interconnected in parallel by an interconnect structure. The interconnect structure comprises at least a first layer and a second layer of conductive metallization defining source, drain and gate buses. The source, gate and drain buses extend between sections of the array and interconnect in parallel the respective source, drain and gate of each transistor section. Each transistor section of the array comprises a set of transistor cells or islands interconnected in parallel, with each transistor cell or island comprising a source electrode, drain electrode and gate electrode. In some embodiments, the transistor islands may comprise isolated islands. In some embodiments, each transistor section comprises an arrangement of transistor building blocks comprising alternating source electrode fingers and drain electrode fingers, with gate electrodes extending in channel regions between each adjacent source and drain electrode finger.

For improved gate drive phase equalization, tracks of the gate bus and the gate return part of the source bus form a gate drive loop for each transistor section, for connection of a gate pad and a gate return pad (alternatively referred to as a source sense pad) to a gate drive voltage supply; the conductive tracks of the source bus run directly over or under those of the gate bus; and the gate bus and the source bus for each section of the transistor are inductively coupled for flux cancellation of the gate current in the gate drive loop of each transistor section.

One aspect of the invention provides a lateral GaN (gallium nitride) power transistor comprising:
a substrate comprising a device area of the transistor;
a nitride semiconductor epitaxial layer stack formed on the device area of the substrate, the nitride semiconductor epitaxial layer stack comprising a GaN heterostructure defining active regions for a plurality of transistor islands of a multi-island transistor, each active region comprising a two-dimensional electron gas (2DEG) region; each transistor island comprising a source electrode and a drain electrode formed on a respective active region, and a gate electrode formed on a channel region between the source and drain electrodes;
the transistor being arranged as an array of transistor sections wherein each section comprises a set of the transistor islands;
at least a first layer and a second layer of conductive metallization defining an (overlying) interconnect structure comprising a drain bus, a source bus and a gate bus; the drain bus interconnecting drain electrodes of each section in parallel, the source bus connecting source electrodes of each section in parallel, and the gate bus connecting gate electrodes of each section in parallel;
the gate bus extending to a gate pad and the source bus extending to a gate return pad (source sense pad) adjacent the gate pad, for connection of the gate pad and gate return pad to a gate drive voltage supply;
the gate bus and the source bus being provided by different layers of said at least first and second layers of conductive metallization, and conductive tracks of the source bus running directly over or under the conductive tracks of the gate bus and separated therefrom only by a layer or layers of intermetal dielectric, the gate bus and a gate return part of the source bus thereby forming a gate drive loop for each section of the transistor, wherein the gate bus and the source bus for each section of the transistor are inductively coupled for flux cancellation of the gate current and gate return current in the gate drive loop of each transistor section, and wherein parameters comprising: layout and routing of conductive tracks of the gate bus and the source bus; lateral dimensions comprising a track width of the gate bus and the source bus; and a thickness of the layer or layers of intermetal dielectric separating the gate bus and source bus; are configured to reduce the gate loop inductance for each section of the transistor.

In an embodiment, the drain bus has a first portion extending (in a first direction) along a first edge of the device area and a plurality of second portions of the drain bus extending from the first portion (in a second direction) between sections and interconnecting in parallel the drain electrodes of transistor islands of adjacent sections; the source bus has a first portion extending (in the first direction) along a second edge of the device area, and a plurality of second portions extending from the first portion (in the second direction) between sections of transistor islands and interconnecting in parallel the source electrodes of transistor islands of adjacent sections; the second portions of the drain bus and second portions of the source bus alternate between adjacent pairs of sections; and the gate bus has a first portion extending (in the first direction) along the second edge of the device area and a plurality of second portions extending from the first portion (in the second direction) between sections of transistor islands and interconnecting in parallel the gate electrodes of transistor islands of adjacent sections.

The conductive tracks of the gate bus and the gate return part of the source bus are preferably matched to have the same lateral dimensions, i.e. similar track widths, to provide equal parasitic inductances. Thus, the gate drive current and gate drive return current, which flow in opposite directions in the two overlying conductive layers of the gate bus and the gate return part of the source bus forming the gate drive loop, provide for flux cancellation of the parasitic inductances for driving each section of the transistor. This effect reduces the gate delay in the gate drive loop of each section of the transistor. For a large area transistor, a key objective of flux cancellation is to reduce gate delays for each transistor island or cell, so that the gate phase difference across a large-scale transistor is significantly reduced, and preferably minimized. For example, in preferred embodiments, the parameters are adjusted to ensure the gate phase difference for each of a plurality of sections of a large area, multi-section transistor is minimized. Simulation results indicate that, with appropriate selection of parameters, flux cancellation can reduce the inductance of the gate drive loop for each section of the transistor by two orders of magnitude.

In some embodiments, the sections of the lateral GaN transistor are arranged as a linear array of a plurality of sections, the gate pad and adjacent gate return pad are provided at one side of the array, and a second gate pad and adjacent gate return pad are provided at an opposite side of the array.

In some embodiments, the track widths of the conductive tracks of the gate bus and the source bus are matched, i.e. are substantially the same width, to improve electromagnetic coupling and flux cancellation. While matching of the track widths of the gate bus and source bus improves flux cancellation, simulation results indicate that another important parameter is the separation of the tracks of the source bus and gate bus, which is determined by the thickness of the intermetal dielectric layer or layers.

For example, simulation results indicate that when the gate bus and the source bus are separated by a layer of intermetal dielectric having a thickness of ~100 µm, flux cancellation potentially reduces the inductance of the gate drive loop for each transistor section by a factor of ~25. Thinner intermetal dielectric, e.g., ~5 µm, may reduce inductance by another factor of 4. These simulation results suggest that appropriate selection of parameters, comprising the layout of the source and gate buses, matching of track widths of the gate bus and source bus, and appropriate interlayer separation of the gate and source buses can result in a reduction of inductance in the gate loop of two orders of magnitude or more. These parameters may be configured to provide a gate loop inductance for each section of the transistor which maintains operational parameters of the gate loop close to a critically damped and stable operational condition.

The disclosed transistor topologies provide for scalability of the device, i.e. integration of an array of a large number of transistor sections connected in parallel, to enable fabrication of very large area, high current lateral GaN power transistors with minimal or significantly reduced gate phase difference across the transistor. For example, the transistor topology may comprise a linear array of sections to provide a large gate width (Wg) lateral GaN transistor, e.g. a gate width exceeding 1.5 m on die size of 5 mm by 13 mm. This topology is scalable to provide transistors of several times this size. If required, a two-dimensional array of transistor sections may be provided.

For example, this topology may be used to form large area lateral GaN power transistors, such as GaN E-mode HEMTs, fabricated on a silicon substrate.

The lateral GaN transistor may further comprise: an overlying current redistribution structure comprising a low inductance metallization layer defining source conductive tracks, formed directly on the source bus, and drain conductive tracks, formed directly on the drain bus, and pads on the gate pad and gate return pad.

For example, for improved current distribution, i.e. higher current handling and reduced current density in the source and drain buses, a current redistribution structure of thicker metal, such as a copper redistribution layer (RDL) or additional layers of on-chip metallization, is provided on the source bus and on the drain bus, gate pad and gate return pad. In some embodiments, the RDL extends laterally of the underlying source bus and drain bus for reduced current density. In some embodiments, a current redistribution structure is provided on the source bus and on the drain bus, comprising an overlying conductive metal layer which is patterned to substantially match the lateral dimensions of the underlying source bus and drain bus for improved coupling efficiency of the source bus and drain bus with the overlying redistribution structure, while reducing unwanted electromagnetic coupling to the underlying active areas of the transistor sections. The overlying metal layer may have a significantly greater thickness than the tracks of the underlying source bus and drain bus for reduced current density. Preferably, the lateral dimensions of the source conductive tracks and drain conductive tracks are no greater than the lateral dimensions of the respective underlying source and drain buses, so that the source conductive tracks and drain conductive tracks do not extend over active regions of the transistor islands. If the track width of the redistribution layer, e.g. copper RDL, is wider than the underlying track width of the source or drain bus, this reduces the effective inductive/electromagnetic coupling with the underlying conductive track of the source and drain buses. Thus, for improved coupling, the track width of the redistribution layer is preferably the same as, or slightly narrower, than the track width of the underlying source bus or drain bus.

The low inductance metallization layer may comprise a copper redistribution layer (RDL), wherein the RDL layer has a track width that is substantially the same as a track width of the underlying source and drain buses. Preferably, the copper RDL layer has a track width that is not greater than that of the underlying source and drain buses. That is, the RDL layer does not extend beyond the underlying source bus and drain bus, and does not overlap the adjacent active regions of the transistor island. An extra thick RDL layer may be provided for reduced current density and increased current handling capacity.

For example, where the on-chip metallization layers forming the source, drain and gate buses have a thickness of e.g. ~4 µm, the low inductance metallization layer forming the redistribution structure has a thickness of tens of microns, such as 40 µm. Thus, the thickness of the redistribution layer is at least several times greater, and may be at least 10 times greater than the thickness of the on-chip metallization layer defining the underlying source and drain buses, to provide an appropriate current density and current handling capacity in the current redistribution layer.

Another aspect of the invention provides a large area/high current lateral GaN transistor, the transistor comprising a plurality of transistor islands forming a multi-island transistor, each island comprising a source, drain and gate electrode, and the multi-island transistor being arranged as an array of a plurality of sections, each section containing a set of said transistor islands; and an overlying interconnect structure comprising at least one conductive metallization layer defining a drain bus, a source bus and a gate bus; the source, gate and drain buses extending between sections of the array and interconnecting in parallel the individual transistor islands of each section; and an overlying current redistribution structure, the current redistribution structure comprising a layer of low inductance metallization defining source conductive tracks formed directly on the source bus and drain conductive tracks formed directly on the drain bus, a gate pad on the gate bus, and a gate return pad on a gate return part of the source bus; the source conductive tracks and the drain conductive tracks of the redistribution structure being patterned to substantially match the lateral dimensions of the underlying source bus and drain bus.

Beneficially, tracks of the redistribution layer have the same width or are narrower than the underlying bus, and have a thickness greater than that of the underlying on-chip metal to provide a suitable current density and current handling capacity.

Thus, scalable transistor topologies, with improved gate drive phase equalization and high current handling capacity are provided for devices and systems comprising lateral GaN power transistors, with particular application for large area, high current lateral GaN HEMTS, that mitigate or circumvent one or more limitations of known devices and systems.

BRIEF DESCRIPTION OF THE DRAWINGS

In the drawings, identical or corresponding elements in the different Figures have the same reference numeral, or corresponding elements of different embodiments have reference numerals incremented by 100 in successive Figures.

FIG. 5 shows a schematic representation of first and second level conductive metallization layers M1 and M2 arranged as two overlying buses with the forward and return signals flowing in opposite directions to provide flux cancellation;

FIG. 6 shows a schematic cross-sectional representation of the first and second level conductive metallization layers of FIG. 5, arranged to provide flux cancellation;

The foregoing and other objects, features, aspects and advantages of the present invention will become more apparent from the following detailed description, taken in conjunction with the accompanying drawings, of embodiments of the invention, which description is by way of example only.

DETAILED DESCRIPTION OF EMBODIMENTS

Figure 1:
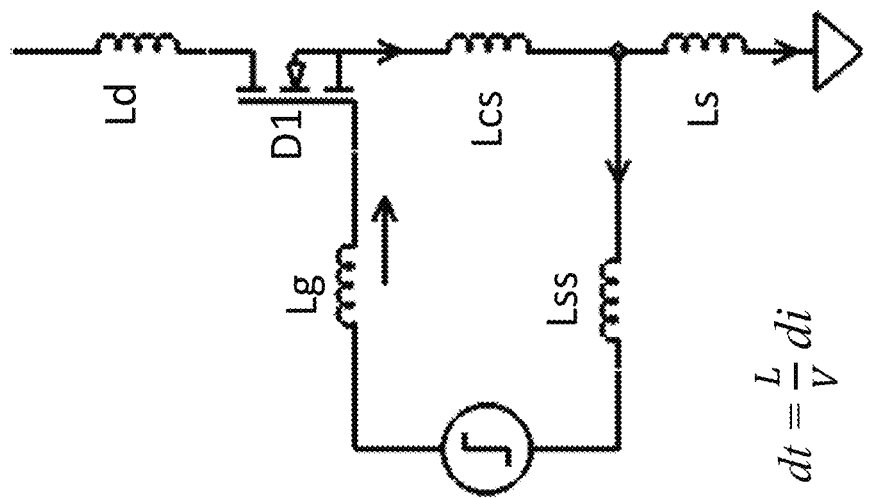
FIG. 1 (Prior Art) shows a circuit schematic of a lateral GaN transistor connected to a gate drive supply voltage, to illustrate parasitic inductances, including parasitic inductances of the gate drive loop.

A circuit schematic of a lateral GaN transistor D1 connected to a gate drive supply voltage is shown in FIG. 1 (Prior Art) to illustrate parasitic inductances of the gate loop. That is, the gate delay is directly proportional to the total gate loop inductances dt=L/V di. The gate loop inductance includes the inductance of the gate drive path Lg, inductance of the gate return path Lss and the common source inductance Lcs. The drain inductance Ld and source inductance Ls in the power loop is also shown; the latter may include package interconnect inductances.

Figure 2:
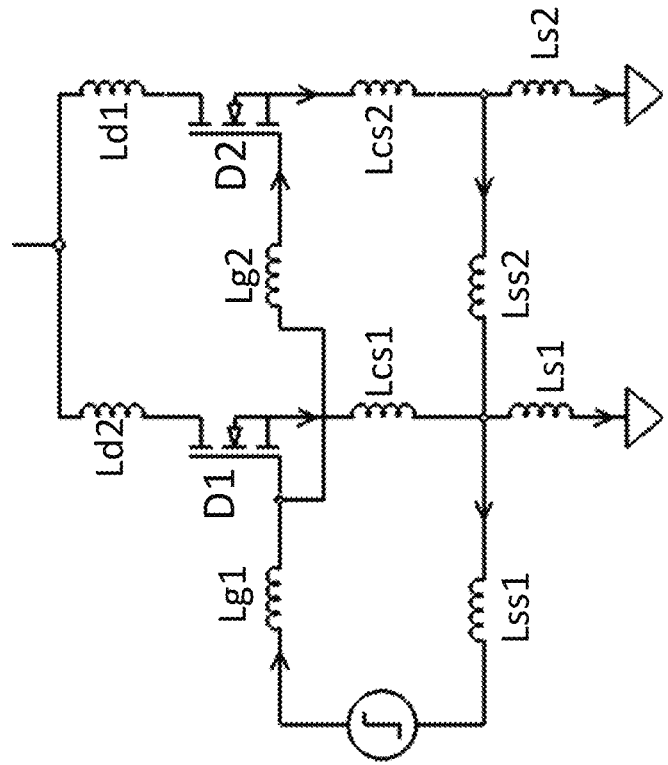
FIG. 2 (Prior Art) shows a circuit schematic of a device comprising two lateral GaN transistor elements interconnected in parallel and connected to a single gate drive supply voltage to illustrate parasitic inductances, including parasitic inductances of the gate drive loops for each transistor element.

When two transistors are interconnected in parallel, for example as shown in the circuit schematic of FIG. 2 (Prior Art) comprising two a large area lateral GaN transistor elements D1 and D2 interconnected in parallel to a single gate drive supply voltage, it will be apparent that the difference in length of conductive tracks for each transistor element means that the gate loop inductance for the second transistor D2 (i.e. comprising Lg1, Lg2, Lss1, Lss2 and Lcs2) is greater than that of the first transistor D1 (i.e. comprising only Lg1, Lss1 and Lcs1), resulting in a longer gate delay for D2.

Figure 3:
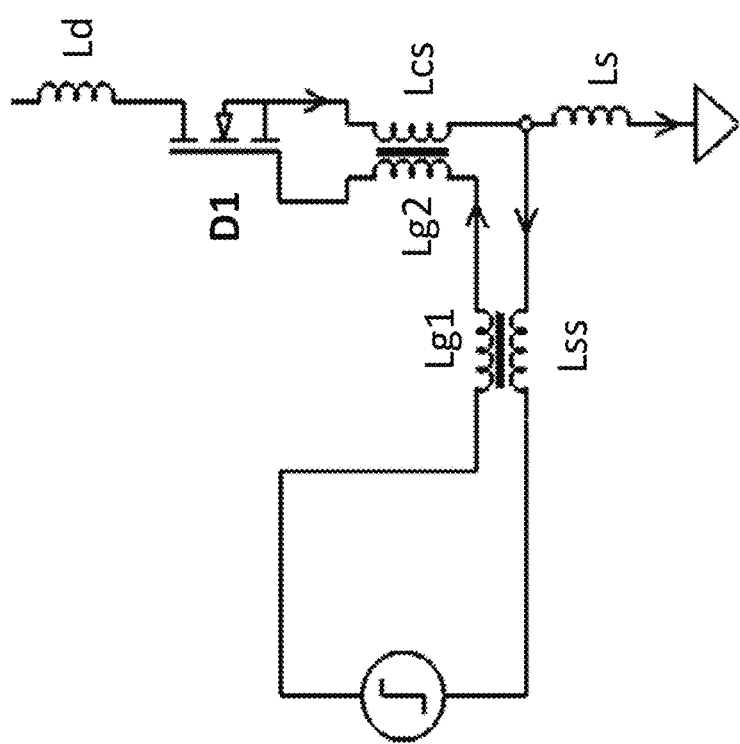
FIG. 3 shows a circuit schematic for a large area lateral GaN transistor according to an embodiment in which the conductive tracks of the gate drive loop are arranged to provide flux cancellation to reduce gate drive loop inductance and gate delay.

A circuit schematic for a lateral GaN transistor with a gate drive supply according to an embodiment of the present invention is shown in FIG. 3, in which the conductive tracks of the gate drive loop are arranged to provide flux cancellation to reduce the inductance of the gate loop. That is, the gate drive signal and gate drive return signal flow in opposite directions through Lg1 and Lss and through Lg2 and Lcs resulting in flux cancellation. In a single transistor, flux cancellation significantly reduces the interconnect inductances in the gate loop, which results in reduced gate delay, increased switching speed and reduction of switching loss.

Figure 4:
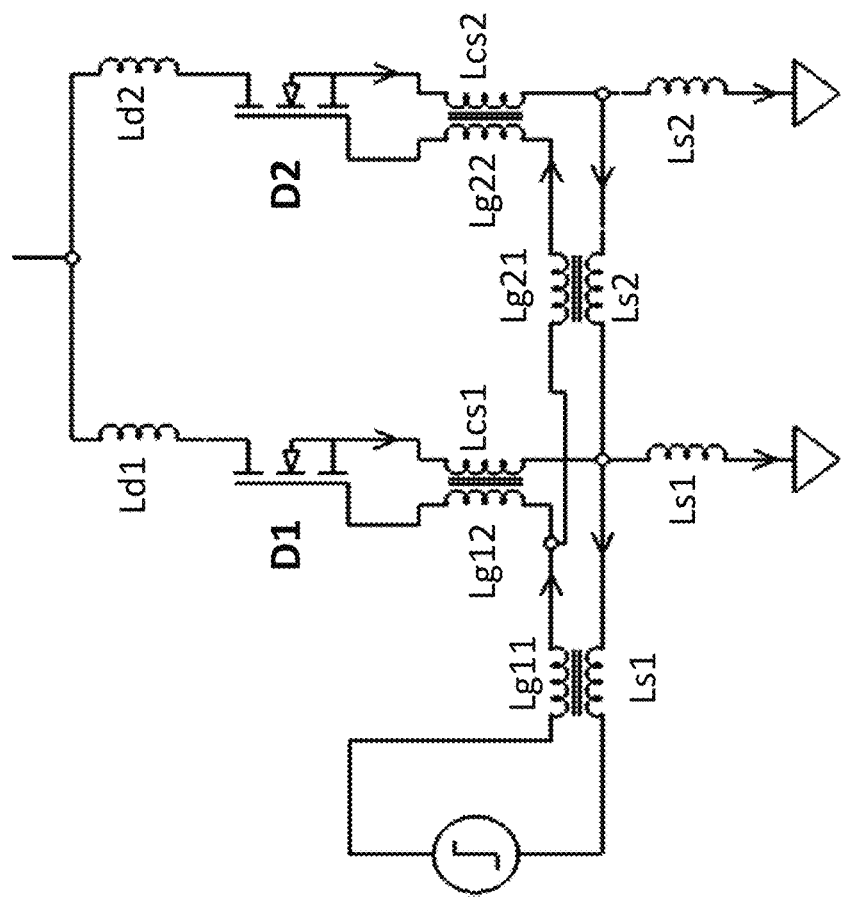
FIG. 4 shows a circuit schematic of a device comprising two large area lateral GaN transistors interconnected in parallel and connected to a gate drive supply voltage according to an embodiment in which the conductive tracks of the gate drive loops for each transistor are arranged to provide flux cancellation to reduce gate drive loop inductance and gate delays, and reduce gate phase differences.

A circuit schematic of a device comprising two large area lateral GaN transistors D1 and D2 interconnected in parallel with a single gate drive voltage supply according to an embodiment of the present invention is shown in FIG. 4, in which the conductive tracks of the gate drive loops for each transistor are arranged to provide flux cancellation, to improve equalization of gate delays of the two transistors. To synchronize turn-on of D1 and D2, ideally the gate delays of D1 and D2 are equalized.

Flux cancellation can be implemented in the gate loop of a lateral GaN transistor, such as an E-mode GaN HEMT, by appropriate layout of the conductive tracks forming the gate loop, and in particular, by providing an overlapped pair of buses for the gate drive and gate drive return loop, as illustrated schematically in FIG. 5. That is, FIG. 5 shows a schematic representation of first and second level metallization layers, M1 and M2, arranged one on top of the other, to provide flux cancellation and reduce gate delay caused by parasitic inductances. Preferably, the overlapped pair of buses for the gate drive and gate return loop are matched in lateral dimensions, i.e. have the same track width, as illustrated schematically. Inductance cancellation occurs when the gate drive and gate return signals flow in opposite directions in the overlapping buses, as indicated schematically in the cross-sectional view shown in FIG. 6.

Figure 7:
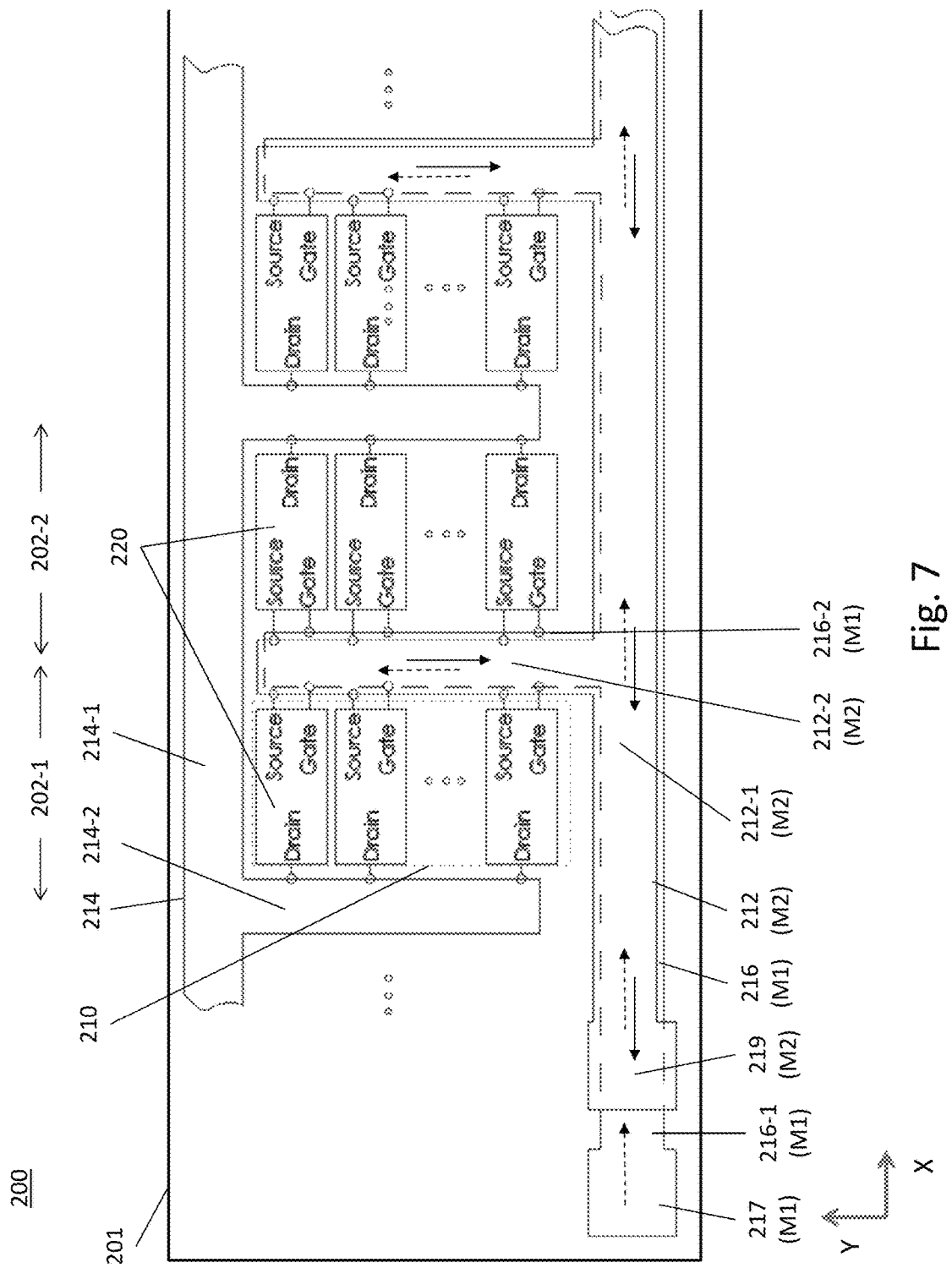
FIG. 7 shows a schematic diagram of part of a large area lateral GaN power transistor according to an embodiment of the present invention, comprising a plurality of sections, wherein each section comprises a set of transistor islands, each comprising individual source, drain and gate electrodes, wherein the drain electrodes are interconnected in parallel by a drain bus, the source electrodes are interconnected in parallel by a source bus, and gate electrodes are interconnected in parallel by a gate bus.

A schematic diagram of the layout of part of a large area lateral GaN power transistor 200 according to an embodiment of the present invention is shown in FIG. 7. The GaN transistor 200 comprises a linear array of sections 202, e.g. 202-1, 202-2. By way of example, only three sections are shown, but the array may comprise many sections of a repeating arrangement of sections 202-1 and 202-2. The active area 210 of each section 202 of the transistor comprises a set of a plurality of transistor islands 220 (which may alternatively be referred to as transistor elements or cells or building blocks), for example, arranged in columns in active regions 210 of each section. Each transistor island 220 comprises source, drain and gate electrodes. The source electrodes of each transistor island are interconnected in parallel by a source bus 212; the drain electrodes of each transistor island are interconnected in parallel by a drain bus 214; and the gate electrodes of each transistor island are interconnected in parallel by a gate bus 216. As illustrated schematically, the drain bus 214 comprises a first portion 214-1 that runs along a first (drain) edge of the device area and second portions 214-2 that extend from the first portion 214-1 and run between columns of islands and interconnect drain electrodes of a set of transistor islands 220. Similarly, the source bus comprises a first portion 212-1 that runs along a second (source) edge of the active area of the transistor and second portions 212-2 that run between columns of islands and interconnect source electrodes of each set of transistor islands. The second portions of the drain bus and of the source bus alternate between sections.

In each section, the gate bus 216 runs directly under the source bus 212, and comprises first portions of the gate bus 216-1 that run along the second (source) edge of the active area of the transistor, and second portions of the gate bus 216-2 that extend from the first portion 216-1 between columns of transistors islands and interconnect gate electrodes of each set of transistor islands. The conductive tracks of the gate bus are formed from a first layer of on-chip conductive metallization (M1). The conductive tracks of the source and drain buses are fabricated from an overlying, second layer of on-chip conductive metallization (M2). A gate pad 217 is provided at the end of the first portion of the gate bus and a gate return pad (or source sense pad) 219 is provided at the end of the first portion of the source bus, adjacent the gate pad. In the simplified schematic diagram shown in FIG. 7, the source bus is shown slightly offset, laterally, from the underlying gate bus to facilitate illustration of both buses. In practice, ideally, the tracks of the gate bus and source bus are fully overlapped, formed from adjacent levels of metal separated by a layer of intermetal dielectric, and the source bus and gate bus are of the same lateral dimensions, to provide maximum coupling for flux cancellation when the gate drive and gate drive return signal flow in opposite directions in the gate drive loop. Thus, the parasitic inductances of the gate loop for each section are reduced through flux cancellation, thereby reducing the gate delay, and reducing the differences in gate delays for each section of the transistor, resulting in improved gate phase equalization. For example, it is estimated that, for source and gate buses which are formed from layers of 4 µm thick on-chip metal, such as aluminium, having a track width of 100 µm, separated by an intermetal dielectric layer having a thickness of several microns to ~100 µm, would provide effective coupling for flux cancellation (see section below entitled Simulation Results).

As illustrated schematically in FIG. 7, X and Y directions are indicated. The first portion of the source bus 212-1 and the first portion of the drain bus 214-1 extend in the X direction along opposite edges of the die. The second portions of source bus 212-2 and the second portions of the drain bus 214-2 extend in the Y-direction between alternating pairs of islands, in a repeating arrangement to form an array of sections. This topology is scalable to form a large area transistor comprising many sections. At least one gate pad and gate return pad are provided at one side of the array, and gate and gate return pads are preferably provided at both sides of the array, for connection of the gate loop to the gate drive signal.

Figure 8:
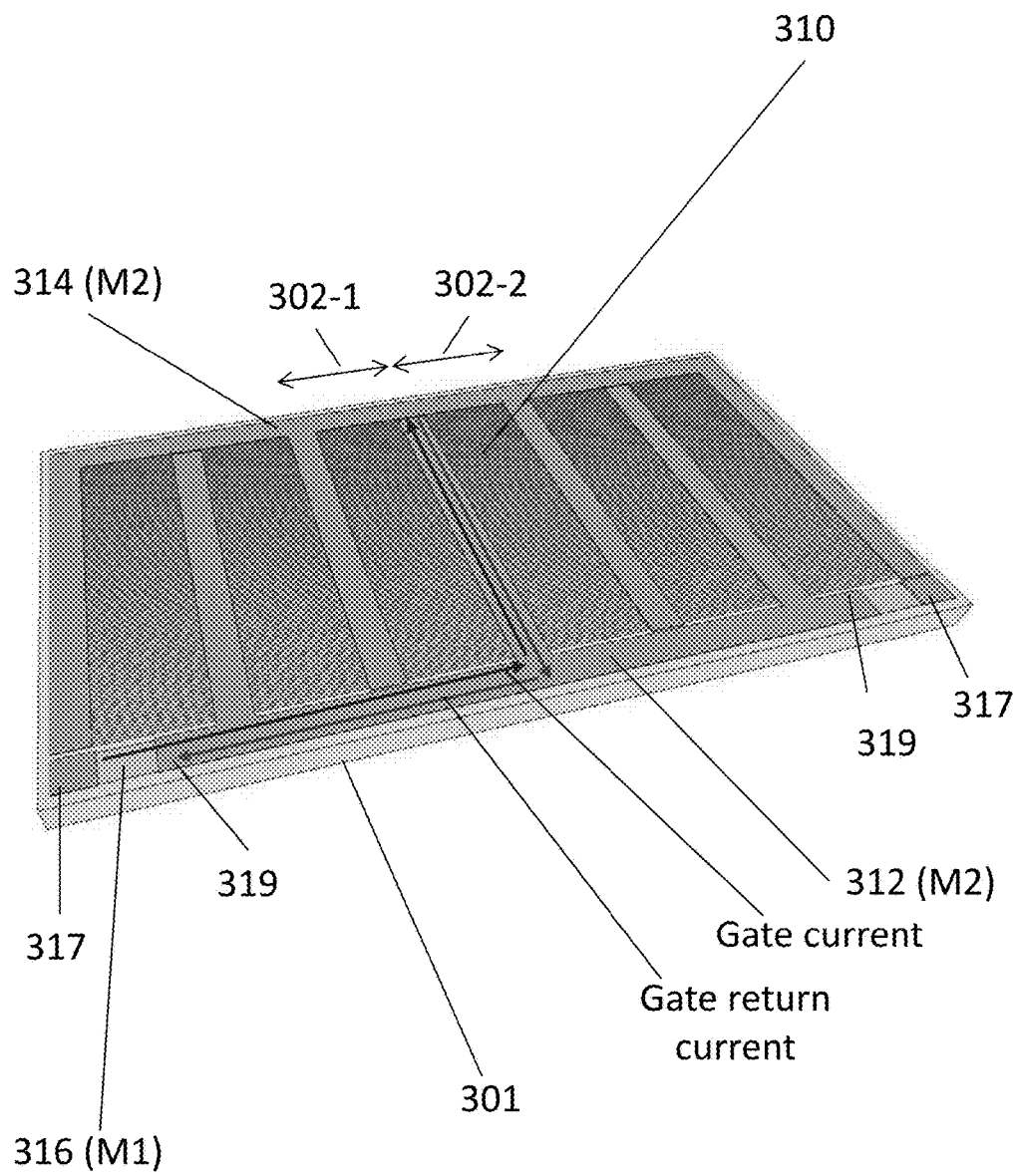
FIG. 8 shows a schematic diagram of a die comprising a large area lateral GaN power transistor, according to another embodiment of the present invention, comprising six sections, to show the pattern the metallization layers defining the source and gate return bus, the drain bus, and the gate pad and gate return pad.

As illustrated schematically in FIG. 8, a large area lateral GaN power transistor 300 of another exemplary embodiment is fabricated as a GaN-on-silicon die 301 and comprises 6 sections. The middle sections are indicated as 302-1 and 302-2 and are similar to the sections 202-1 and 202-2 of the GaN power transistor 200 shown schematically in FIG. 7. Each section 302-1 and 302-2 comprises an active region 310 comprising a set of transistor islands. In one arrangement, the transistor islands may comprise source and drain finger electrodes, extending in a X direction, and gate electrodes extending over the channel region between each adjacent source and drain finger electrodes In each section, the source, drain and gate electrodes of each transistor island are interconnected, respectively, to the nearest source bus 312, drain bus 314, and gate bus 316, as illustrated schematically in FIG. 7. The source bus 312 and the drain bus 314 are formed by a second level of on-chip metallization (M2), and the underlying gate bus 316 is formed by a first level of on-chip metallization (M1). Gate pads 317 and gate return pads 319 are provided at each side of the GaN die 300. For the middle sections 302-1 and 302-2, the paths of the gate drive current and gate drive return current are indicated schematically by the arrows for one gate pad and one gate return pad, at one side of the chip. Gate pads and gate return pads may be provided at each side of the chip. However, if only one gate pad is used, then to take advantage of flux cancellation, the gate pad and gate return pad on the same side of the chip are used.

After completion of the on-chip metallization layer M2 defining the source bus 312 and drain bus 314, the GaN die is passivated, as is conventional, with a die passivation layer comprising a thick layer of dielectric (not shown), leaving contact openings for the source bus, drain bus, and gate pad and gate return pad. For connection of the source and drain buses to source and drain pads of the die packaging, an intermediate layer of a low inductance metallization may be used to provide source and drain contact areas, and gate and gate return pads.

Figure 9:
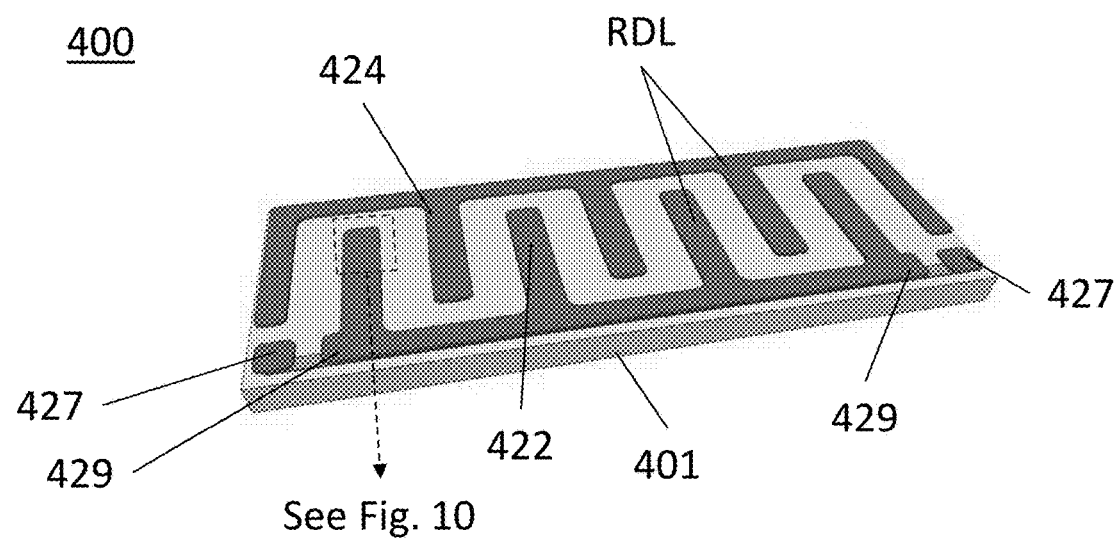
FIG. 9 shows a schematic diagram of the large area lateral GaN transistor die, similar to that shown in FIG. 8, further comprising an overlying copper redistribution layer (RDL) comprising large area source and drain contact areas having interleaved source and drain extensions.

As an example, as shown schematically for the GaN die 400 illustrated in FIG. 9, a redistribution layer (RDL), e.g. copper RDL may be provided. Copper RDL is a post-process step which strengthens the current handling of the die interconnect buses. A thermoplastic dielectric, such as a layer of polyimide, is provided over the die passivation layer, leaving openings to the underlying source bus, drain bus, and gate and gate return pads. Then, the copper RDL is deposited and patterned to form a large area source contact area 422 with source extensions extending over the underlying source bus, and a large area drain contact area 424 with drain extensions extending over the underlying drain bus. The extensions of the source and drain contact areas 422 and 424 of the copper RDL are interleaved, and each makes contact with the respective underlying source bus 412 and drain bus 414. The extensions of the source contact area 422 and drain contact area 424 extend laterally over the active area comprising the transistor islands 420, as illustrated in more detail in the enlarged view around one tapered extension of the source contact area shown in FIG. 10, and in the enlarged cross-sectional view through the tapered extension shown in FIG. 11.

Figure 10:
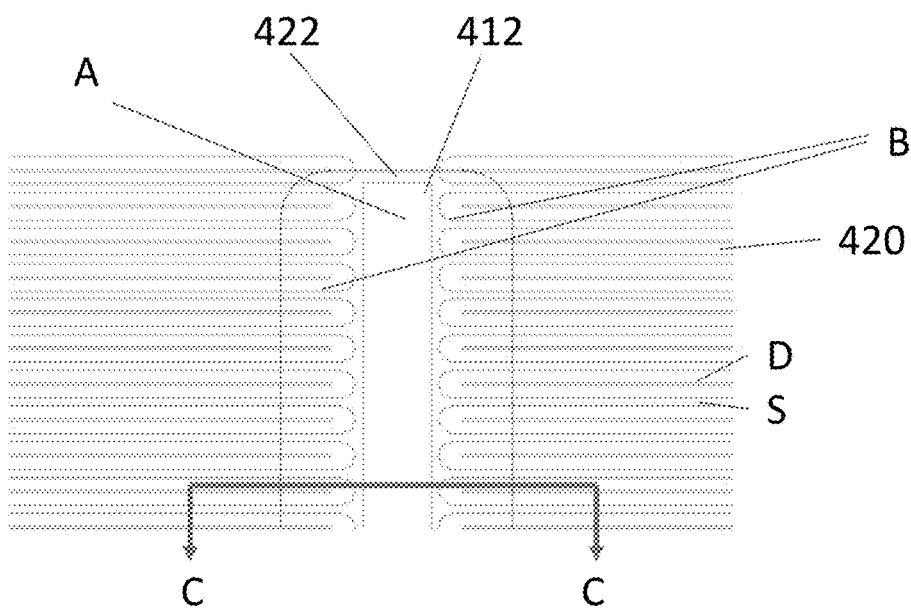
FIG. 10 shows an enlarged schematic diagram of a top view of part of the large area lateral GaN transistor die of FIG. 9, to show details of the underlying source and drain electrodes of a plurality of transistor islands, wherein the source electrodes are connected to the source bus, and the overlying copper RDL is patterned to provide a source extension which contacts the underlying source bus and extends laterally of the underlying source bus.
Figure 11:
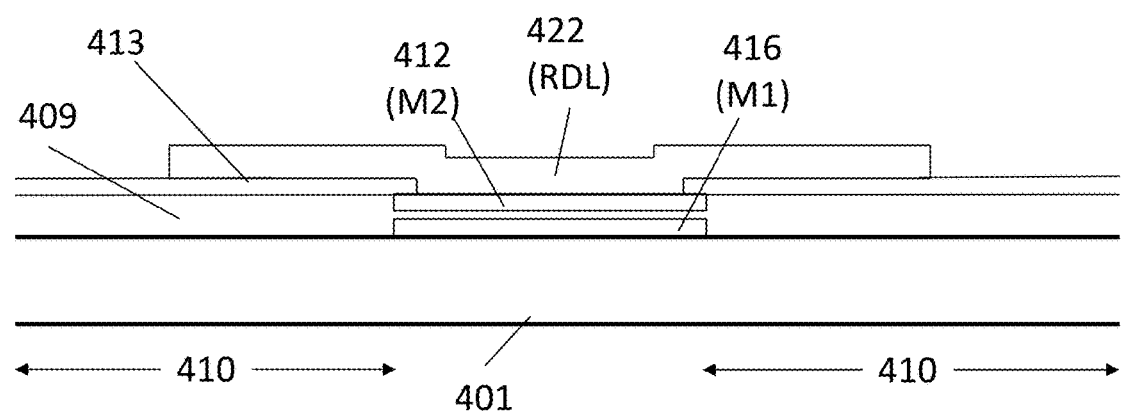
FIG. 11 shows a cross-sectional view through section C-C of the device structure of FIG. 10 to show metal layers of the gate bus (M1), source bus (M2) and overlying copper RDL.

That is, as shown in FIG. 10, the set of transistor islands or transistor elements 420 comprise source electrode fingers S and drain electrode fingers D, with gate electrode fingers extending over the channel region between each S/D electrode pair. As illustrated schematically, the source electrodes of each transistor element are interconnected to the source bus 412. The overlying source extension of the source RDL makes contact with the underlying source bus in area A. In areas B, the source RDL extends laterally over the active area comprising the transistor elements 420. As shown in the enlarged cross-sectional schematic shown in FIG. 11, which is taken through section C-C of FIG. 10, the RDL is separated from the underlying active area 410 by the underlying polyimide layer 413 and on-chip die passivation layer 409. To simplify FIG. 11, the cross-section illustrated is taken between the source, drain and gate finger electrodes and thus FIG. 11 shows only parts of layers M1 and M2 which form the gate bus and overlying source bus, and the source, drain and gate fingers over the active area 410 are omitted. The overlying source extension of the source RDL extends laterally of the underlying source bus to provide for large area, low inductance interconnections to the package source contact pads. The drain RDL is similarly structured. The resulting structure of the source and drain RDL provides for reduced current density for improved current handling capability and allows for larger area, low inductance interconnections to the source and drain pads of a die package. The copper RDL also provides a low inductance/resistance interconnect path to the gate pads and gate return pads for the gate drive network.

For example, adding copper RDL of this structure reduces the die metal resistance, e.g. from 10 mΩ to ≤3 mΩ when the second portions of the source and drain buses are used as source and drain pads. The impact of electro-migration (EM) on lifetime is made more consistent throughout the die. This interconnect structure allows for embedded packaging, such as described in the above referenced U.S. Pat. No. 9,659,854.

Alternatively, the copper RDL of the GaN die may be interconnected to the package metallization by copper pillars and an interposer, as described for example in the above referenced U.S. Pat. No. 9,589,868. The above referenced U.S. Pat. No. 9,589,869, provides another option for packaging of a large area lateral GaN transistor with a similar pattern of copper RDL for the source and drain contacts.

On the other hand, in these examples, since the extensions of the source RDL extend laterally over the active areas of the transistor islands, there is some electromagnetic/inductive coupling between the RDL layer and the underlying active areas of the transistor islands.

Figure 12:
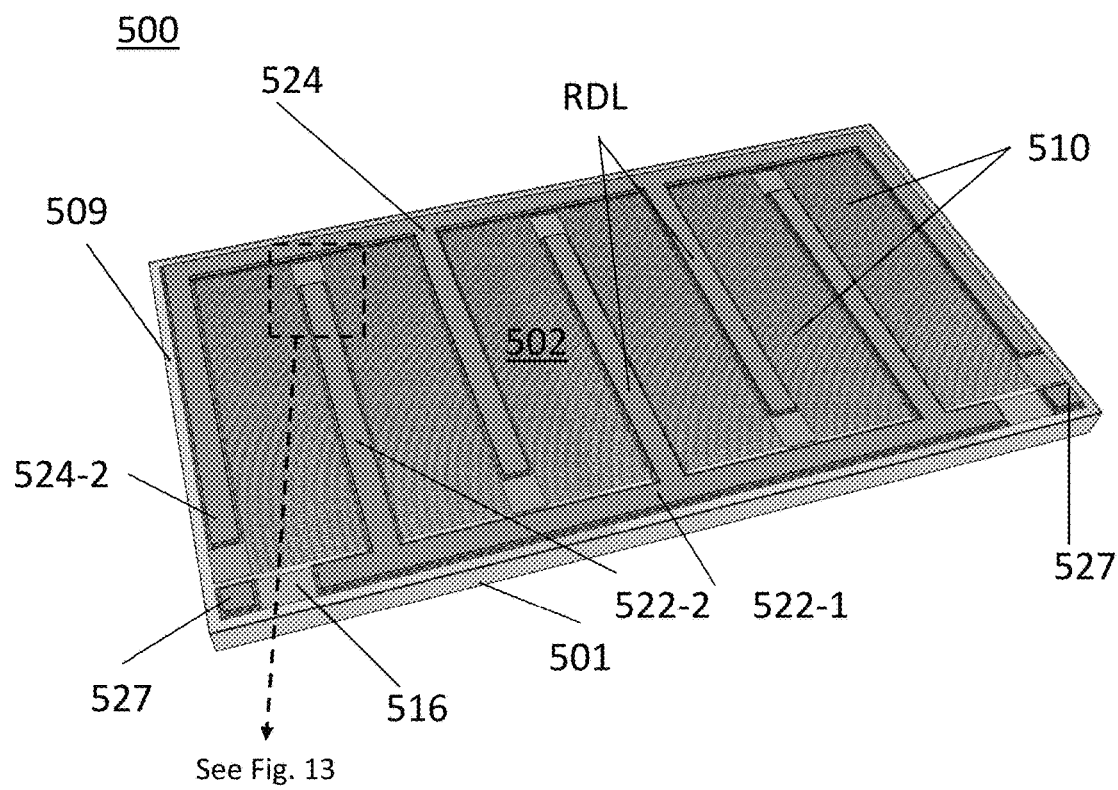
FIG. 12 shows a schematic diagram of a large area lateral GaN transistor die of an embodiment similar to that shown in FIG. 8, further comprising an overlying copper redistribution layer (RDL) which is patterned to match the lateral dimensions of the underlying drain and source buses.

To take advantage of flux cancellation for gate phase equalization, as described with respect to the GaN transistor structure 300 shown in FIG. 8, it is also desirable to maximize coupling between the overlying current redistribution layer and the underlying source bus and drain bus, and to minimize unwanted coupling of the redistribution layer to the underlying active regions of the transistor islands. Accordingly, FIG. 12 shows a schematic diagram of a large area lateral GaN transistor die 500 according to a preferred embodiment of the present invention, wherein a redistribution structure is provided and wherein the source, drain and gate interconnect layers comprise a copper redistribution layer (RDL) that is optimized for flux cancellation. That is, the track width of the copper RDL forming the source interconnection 522 is substantially the same width (lateral dimensions) as underlying source bus 512. Also, as illustrated, the track width of the copper RDL forming the drain interconnection 524 is substantially the same width (lateral dimensions) as underlying drain bus 514.

Advantageously, the lateral dimensions of the RDL source and drain tracks are no wider than the underlying tracks of the on-chip metal forming the first and second portions of the source and drain buses, and the RDL source and drain tracks are preferably slightly narrower than the tracks of the underlying source and drain buses. For example, as illustrated in the enlarged view of one RDL source portion 522-2 shown in FIG. 13, the contact opening 511 formed in the underlying passivation layer 509 is made slightly narrower than the track width of the underlying second portion of the source bus 512-2. The RDL source portion 522-2 is patterned to fit within the contact opening 511 in passivation layer 509, without contacting sides of the opening 511. As illustrated schematically, the RDL does not need to extend right to the end of the underlying portion 513 of the source bus to effectively collect current from the few transistor islands interconnected to portion 513 of the source bus, and this arrangement provides some separation between the source bus and the drain bus.

The RDL layer is made thicker than the underlying on-chip metal M2, to provide an appropriate current density. Since the RDL of this embodiment, shown in FIGS. 12 13, and 14 has a narrower track width than the underlying source and drain buses, beneficially, the RDL is made significantly thicker, e.g. it is a "thick RDL" which has a thickness which is at least several times thicker than the underlying on-chip metal. That is, since the RDL buses are confined within the track width of the underlying die buses, to take full advantage of flux cancelling for the source bus, a non-standard process is used to provide a RDL of narrower track width and greater thickness than conventional RDL. The thickness is selected to provide a cross-sectional area equivalent to that of more conventional RDL, such as shown in the device structure of the embodiment illustrated schematically in FIG. 9. That is, as illustrated schematically in FIG. 9, RDL of a conventional form has a wider track width than the underlying on-chip metal tracks, and extends laterally of the underlying source and drain buses, to provide an appropriate current density in the RDL tracks. As illustrated in FIG. 14, there is no overlap of the RDL source track 522-2 and the active regions 520 of the lateral GaN transistor, so the thickness of the RDL is increased to provide an equivalent cross-sectional area, which provides a similar current density as the more conventional RDL structure. As an example, the on-chip metal layer forming the source bus may be aluminium having a thickness of several microns, e.g. 4 µm, and a track with of 100 µm. The source RDL is at least several times thicker to provide an RDL thickness of tens of microns. The RDL is preferably at least 5 to 10 times thicker than the on chip-metal, e.g. 40 µm thick. This redistribution structure therefore provides high current handling capability in the source and drain buses.

Figure 13:
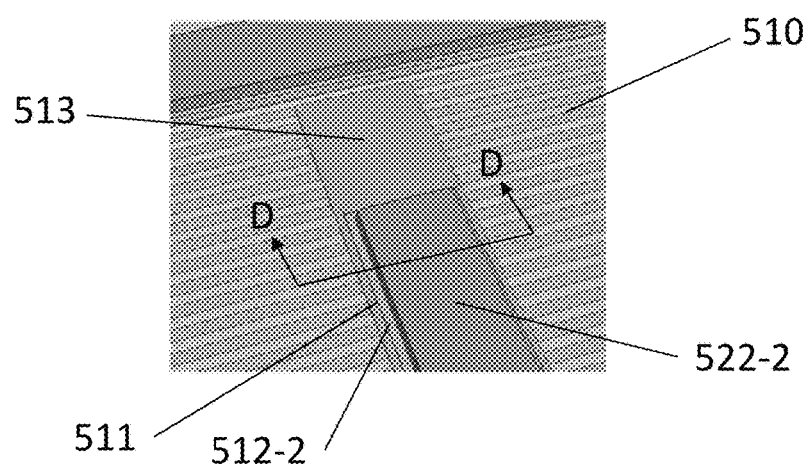
FIG. 13 shows an enlarged schematic diagram of part of the large area lateral GaN transistor die of FIG. 12, to show details of the contact between a source portion of the RDL and the underlying source bus.
Figure 14:
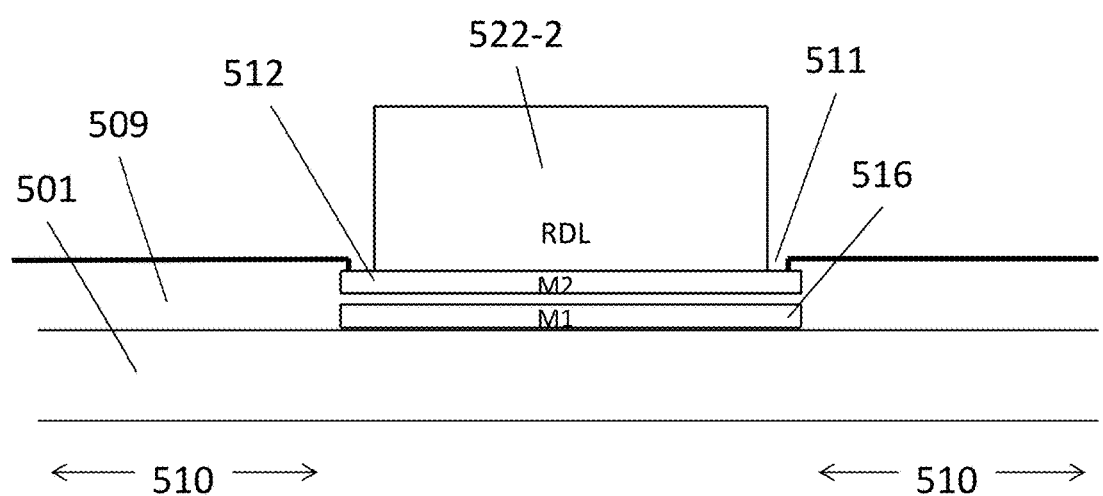
FIG. 14 shows an enlarged schematic cross-sectional diagram through section D-D of FIG. 13, to show metal layers of the gate bus (M1), source bus (M2) and overlying copper RDL.

Another advantage of the interconnect structure shown in FIG. 13 is that the narrow copper RDL can be provided directly inside an opening in the die passivation layer 509, and this eliminates the need for an intermediate dielectric layer, such as a polyimide layer formed on the die passivation layer. For GaN-on-silicon die, and conventional known interconnect structures, there may be issues due to a mismatch of the coefficient of thermal expansion between different materials, e.g. copper used for the RDL, aluminium which is typically used for on-chip metal for both first and second level metallization, and the underlying silicon substrate. When the copper RDL extends over a polyimide dielectric layer as shown in FIG. 9, there may be strain due to polyimide curing and issues of moisture absorption by polyimide. The structure illustrated in FIGS. 13 and 14 potentially helps to circumvent these issues.

In transistor structures of embodiments where the source bus, drain bus and gate and gate return pads comprise narrow thick RDL, such as illustrated in FIGS. 12 to 14, for interconnections of the narrow thick RDL to the source and drain pads of a die package, any suitable interconnect technology may be used. To maintain flux cancellation in the gate drive loop of the die, these interconnections should not pick up the gate return current from the source current on the die. Although wire-bonds may be used, the package interconnections may preferably comprise low inductance interconnections, such as, metal filled laser drilled vias, or copper pillars or metal post connections. Wirebonds may be preferred for lower cost packaging using standard wirebonded packages or support substrates. Conductive posts/pillars and metal filled vias may be preferred for embedded packaging.

Figure 15:
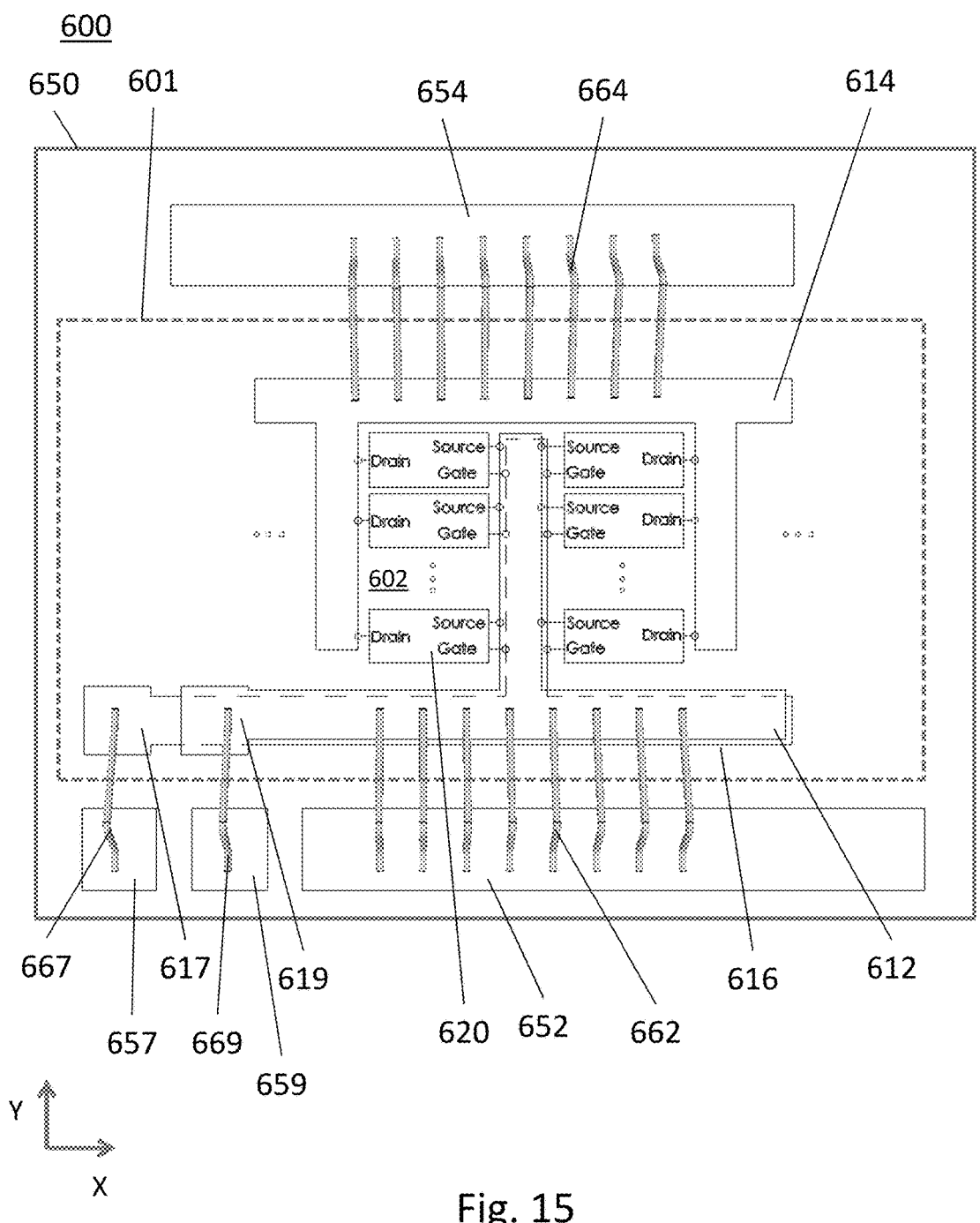
FIG. 15 shows a schematic view of an assembly of a GaN die comprising a lateral GaN transistor of an embodiment similar to that shown in FIG. 7, and a conventional wirebond type package comprising a source contact area, a drain contact area, and gate and gate return contact areas, to illustrate positioning of wirebonded source, drain and gate interconnections between the GaN die and the package.

For example, FIG. 15 shows a schematic diagram of an example of an assembly 600 of a die 601 comprising a lateral GaN transistor according to an embodiment of the invention similar to that shown in FIG. 7 comprising a plurality of sections 602, and a standard wirebonded package 650, showing wirebonded interconnections. For each section 602, a set of source wirebonds 662 extends from the source bus 612 of the die to the source bus 652 of the package; a set of drain wirebonds 664 extends from the drain bus 614 of the die to the drain bus 654 of the package; and wirebonds 667 and 669 are made from the gate pad 617 and gate return pad 619 of the die to the corresponding gate and gate return pads 657 and 659 of the package. As illustrated schematically, the drain wirebonds take the drain current laterally, in a Y-direction, from the drain bus of the die. Correspondingly, source wirebonds take the source current laterally, in a Y-direction from the source bus of the die. Thus, the source current is picked up by the source wirebonds 662 to the source bus and the gate return current flows to the gate return pad 619 in the gate return portion of die source bus.

In alternative embodiments, the interconnections between the source bus, drain bus, gate pad and gate return pad of the GaN die comprising the lateral GaN transistor may be made to the application source, drain and gate buses, i.e. package buses or support substrate buses, using other arrangements of wirebonds or other suitable interconnect structures such as conductive post or pillars, or conductive vias.

Figure 16:
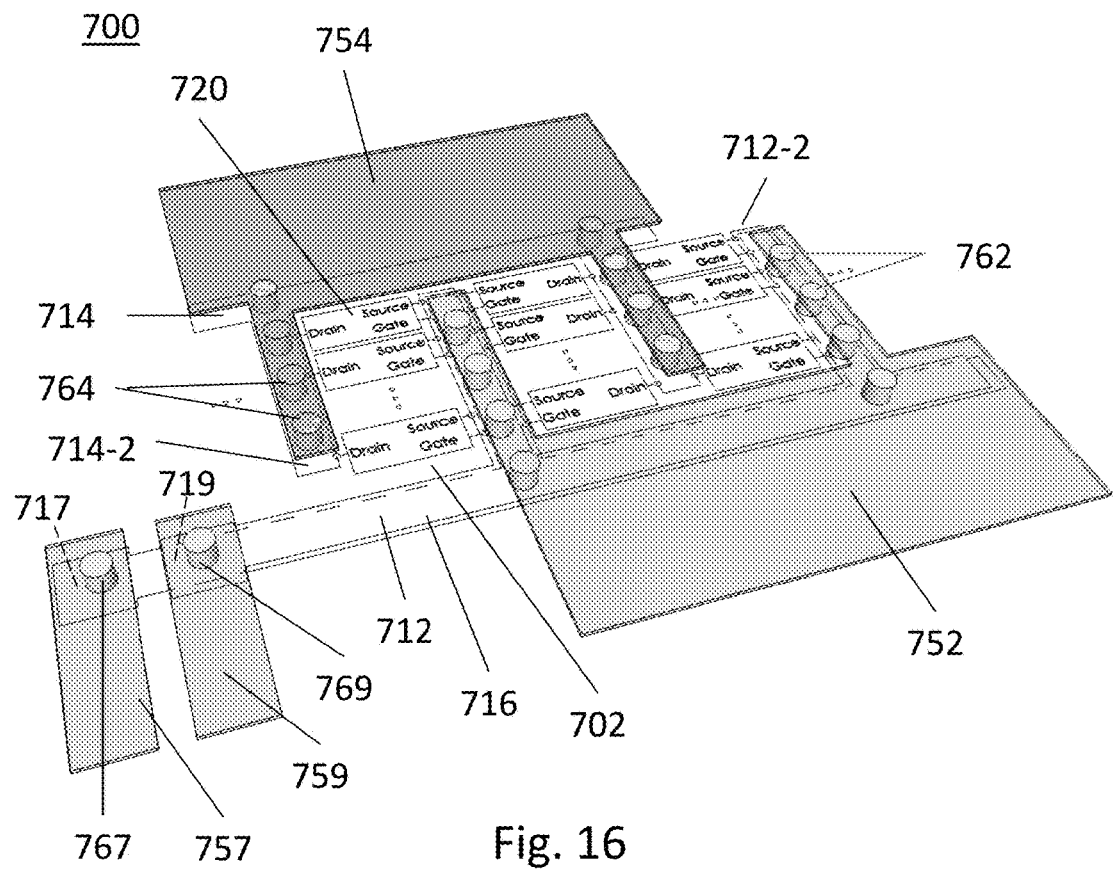
FIG. 16 shows a schematic representation of an assembly of a GaN die comprising a lateral GaN transistor of an embodiment similar to that shown in FIG. 7, with components of an embedded type of package, to illustrate positioning of package interconnections, in the form of low inductance conductive posts, for separation of the power loop and the gate drive loop.

For example, FIG. 16 shows a schematic diagram of an assembly 700 of a die comprising a lateral GaN transistor having a plurality of transistor sections 702, which is configured for embedded packaging. Sections of the transistor are arranged similarly to those of the transistor structure shown in FIG. 7. FIG. 16 shows positioning of conductive interconnections, such as copper posts or pillars or conductive vias, for interconnection of the die source bus 712, the die drain bus 714, the die gate pad 717 and the die gate return pad 719 to the corresponding buses of the package. For example, the embedded package comprises a source bus 752, a drain bus 754, a gate pad 757 and a gate return pad 759. Package interconnections to the source bus and drain bus for the power loop are made to the second portions 712-2 of the source bus and the second portions 714-2 of the drain bus. Interconnections for the gate drive loop are provided to the gate and gate return pads. That is, the main source current is picked up by the copper pillars on the second portions 712-2 of the die source bus but gate return current is maintained in the first portion of the die source bus to be picked up at the gate return pad.

Advantageously, this type of interconnect arrangement provides for separation of the power loop and the gate drive loop. The die source bus carries the power loop current as well as the gate return current. The source interconnects 762, e.g. copper pillars, pick up the power loop current from the second portions 712-2 of the source bus, and the gate return current is maintained in the die source bus to be picked up at the gate return pad 719. Other interconnect types such as wire bonds, laser vias filled with conductive metallization, copper pillars or posts may be used for the interconnections to the second portions of the source and drain buses. However, those interconnects should not pick up gate return current from the die source bus. This way, effective flux cancellation will happen within the gate loop.

The device topology for high current lateral GaN transistors disclosed herein is scalable to provide large area, large gate width power transistors, which are package independent. For example, the device layout is compatible with standard wirebonded packages, or can be used with embedded packaging and low inductance interconnects, such as metal pillars, posts and conductive vias.

Figure 17:
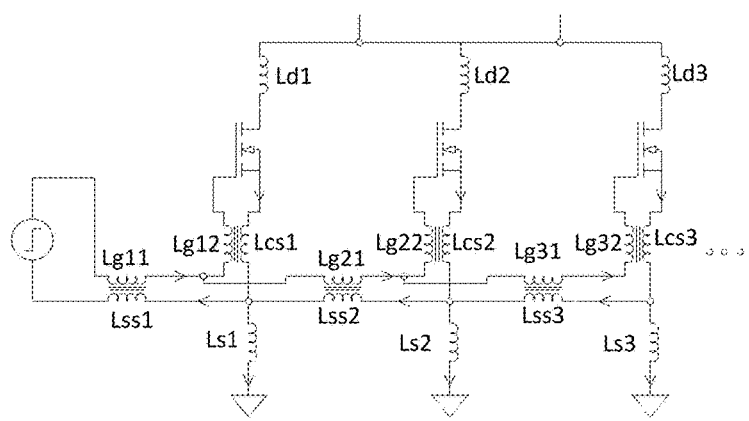
FIG. 17 shows a circuit schematic to illustrate separation of the power loop and the gate drive loop for a lateral GaN transistor structure such as illustrated in FIG. 16.

As is well known, common source inductance (CSI) increases turn-on and turn-off times which leads to higher switching losses. Separating the power loop from the gate loop, as illustrated, for example, in FIGS. 16 and 17, increases switching transistor efficiency. Flux cancellation in the gate loop, as described herein, for a large area lateral GaN power transistor comprising a plurality of sections, reduces the gate delay in the gate drive loop for each section for improved switching speed of each section, and provides for improved gate drive phase equalization for the plurality of sections across the transistor. When gate loop flux cancellation is established, separation of the power loop, using low inductance interconnects from the source bus to the package source pad also contributes to increased transistor efficiency. Flux cancellation for gate phase equalization ensures parallel transistor elements work in synchrony, hence equally share switching current and reduce chances of unwanted circuit instability and oscillation due to mixed timing of turn-on/turn-off.

The device topology for lateral GaN transistors presented herein comprising a plurality of sections, wherein each section comprises a plurality of transistor islands, is modular on a per section basis, and provides scalability of the device area for improved efficiency of large area devices. Minimizing turn-on delays between parallel cells is an effective way of protecting lateral GaN transistors from current imbalance during the turn-on regime and preventing oscillations without degrading the device specifications.

Figure 18:
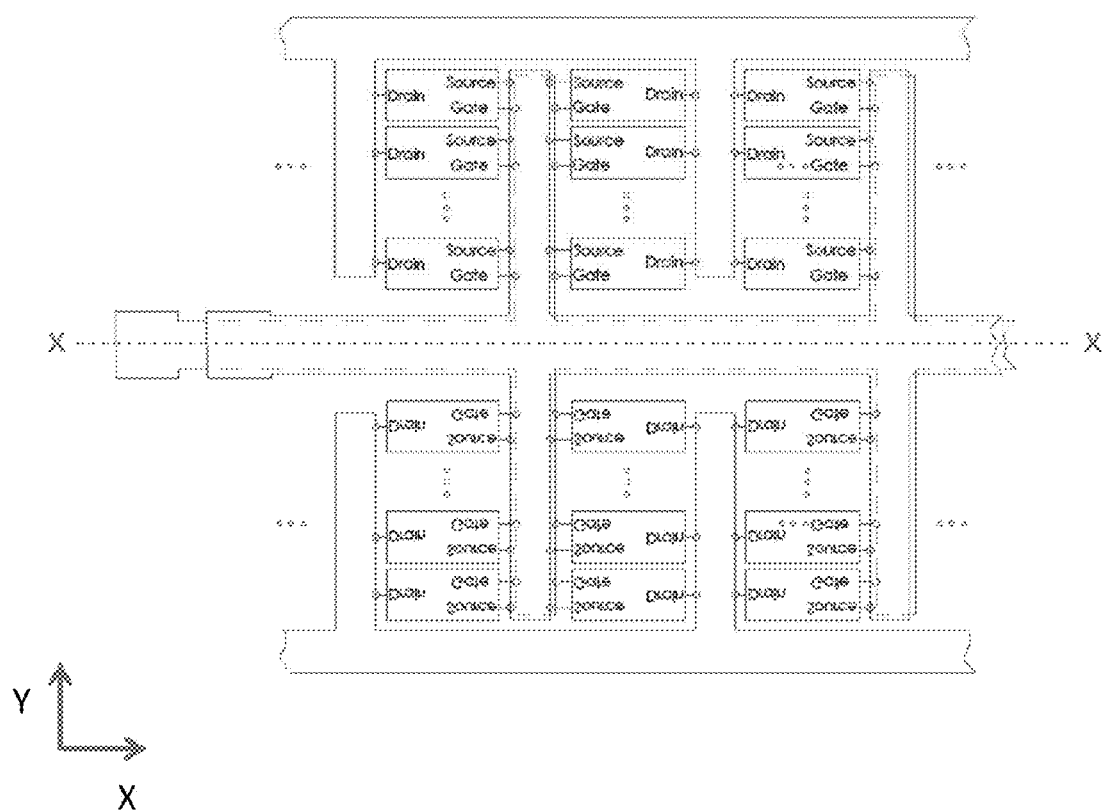
FIG. 18 shows a schematic diagram of a large area lateral GaN transistor of a further embodiment.

The sections can be arranged in a linear array as illustrated schematically in the above referenced Figures, e.g., a row of a plurality of sections extending along an X direction. For a linear array of sections, the size and aspect ratio of the layout may be changed by adding more sections to the array along the X direction and/or elongating the sections in the Y direction. If required, the array of sections may be expanded in the Y direction to form a two-dimensional array of sections. As an example, two rows of sections are provided above and below the first portion of a central source bus and gate bus, and drain buses run along top and bottom edges of the die, as illustrated schematically in FIG. 18, which comprises two building blocks which are mirror images, i.e. flipped about a horizontal axis x-x.

With respect to scalability and yield enhancement, for a large area transistor comprising an array of a large number of sections, if electrical testing identifies one or more defective sections, it is contemplated that interconnections may be arranged to allow for selectively interconnecting only the sections that test good (non-defective) and so that defective sections may be selectively isolated electrically.

A device topology for high current lateral GaN transistors according to exemplary embodiments is disclosed herein which is scalable and package independent. For example, the device layout is compatible with standard wirebonded packages, or can be used interchangeably with embedded packaging and low inductance interconnects such as pillars, posts and conductive vias.

While lateral GaN power transistors according to embodiments of the invention have been described in detail, by way of example, in which the gate bus is provided by the first level of on-chip metal (M1) and the source and drain buses are provided by a second level of on-chip metal (M2), it will be appreciated that flux cancellation may be achieved with the tracks of the gate bus running under or over the tracks of the source bus. Thus, in alternative embodiments, the source and drain buses may be patterned from an underlying metal layer M1 and the gate bus patterned from an overlying metal layer M2. For example, in the latter case, the underlying source bus may be extended laterally of the overlying gate bus to provide a contact area for interconnection of the source bus to the package or application source bus.

More generally, for multilevel metal processes with three or more levels of metallization M1, M2, . . . Mn for n≥3, the source bus and the gate bus may use any two different and adjacent metallization layers which enable the gate bus to be run directly under or over the source bus, using a layout that provides flux cancellation in the gate drive loop, as described herein, to reduce differences in turn-on delays between parallel transistor elements, such as parallel connected islands or sections. As noted herein, the lateral dimensions of tracks defining the gate bus and the source bus are preferably the same to optimize flux cancellation.

Since the drain bus does not require flux cancellation, for device structures comprising two levels of metallization, the drain bus can use either or both of M1 and M2 as a conduction medium. More generally, for multilevel metal processes, the drain bus may use any suitable metal layer which is the same as, or different from the layers used for the source bus and gate bus. On the other hand, the gate bus and the source bus use two different, directly overlying metallization layers, i.e. adjacent metal layers separated only by intermetal dielectric The first and second levels of on-chip metallization may comprise aluminum, an aluminum alloy, aluminum/titanium (Al/Ti), gold, or any other on-chip metal compatible with semiconductor process technologies for fabrication of lateral GaN transistors.

In embodiments described above, the current redistribution structure comprises a redistribution layer (RDL) which is, for example, a copper RDL provided by a post process after completion of on-chip metallization and die passivation. This allows for deposition of a thick copper RDL to provide a smaller current density. In alternative embodiments, for processes using additional multilevel metallization layers on-chip, the additional metal layers, e.g. M3, M4, . . . Mn, may be used to build up a thick metal redistribution layer for each of the source and drain buses using multiple layers of the on-chip metallization. In other alternative embodiments, a combination of multiple on-chip metallization layers and one or more redistribution layers, such as standard or thick copper RDL, may be used to build up a required thickness of conductive metallization for each of the source and drain buses and the gate and gate return pads. That is, the lateral dimensions and thicknesses of the buses are selected to provide a suitable current density and current handling capacity.

The overall active area of the lateral GaN transistor, i.e. comprising the active areas of each of the transistor sections, lie between inactive areas occupied by the drain bus and source bus (i.e. with the gate bus underlying or overlying the area occupied by the source bus). That is, the buses occupy part of the die/device area, and this layout somewhat reduces the available active area of the transistor and the potential gate width Wg per unit of device/die area. On the other hand, since flux cancellation in the gate loop provides improved gate drive phase equalization across the transistor, this device layout is scalable to add more sections to form a very large area multi-section lateral GaN transistor, while minimizing or significantly reducing gate phase differences across the multi-section transistor. For example, using a die size of 5 mm by 13 mm, a lateral GaN power transistor having a gate width in the range of 1.2 m to 1.5 m is feasible. By mitigating the effects of gate phase delay across larger area lateral GaN power transistors, this scalable topology potentially enables fabrication of lateral GaN power transistors of at least several times this size.

Careful design and layout of the conductive tracks of the gate loop, to provide flux cancellation for reduced inductance and gate delay in the gate drive loop of each section of large area lateral GaN power transistors, provides improved gate drive phase equalization. Thus, current imbalance in parallel transistor elements during start-up is reduced. Issues relating to reduced device lifetime due to electro-migration, which are exacerbated under high voltage/high current conditions, are mitigated by improved current balancing across the transistor.

Also, the lateral GaN power transistor layout of embodiments disclosed herein provides for an overlying interconnect structure having lateral dimensions matched to the track width of the underlying buses, which enables efficient current redistribution. The current redistribution structure may comprise additional on-chip metallization layers, post processing to provide a conventional or thick copper redistribution layer, or a combination thereof. The resulting device and interconnect topology can be made package independent, e.g., applicable for both lower cost wirebonded packages, and also compatible with more costly embedded packaging, e.g., using low inductance interconnect schemes such as conductive posts, pillars and metal filled vias.

Simulation Results

The gate loop may be modelled as an RLC circuit with a damping coefficient of $\alpha=R/2L$ and resonant frequency of $$\omega = \sqrt{\frac{1}{LC}}.$$

A damped oscillation starts in the gate loop when $L<R^2C/4$. While the gate inductance for transistor elements which are closer to the gate pad are less likely to exceed this threshold value, this oscillation may occur for the transistor elements further away from the gate pads of large scale transistors.

In an under-damped condition, a far-away transistor element may turn on and off inadvertently due to the oscillation. This oscillation may even affect the transistor elements closer to the gate pad and bring the whole transistor to an unstable condition.

Simulation results indicate that flux cancellation may reduce a gate inductance of at least two orders of magnitude and bring gate inductances of the far-away elements close to or under the threshold of a critically-damped oscillation.

Figure 19:
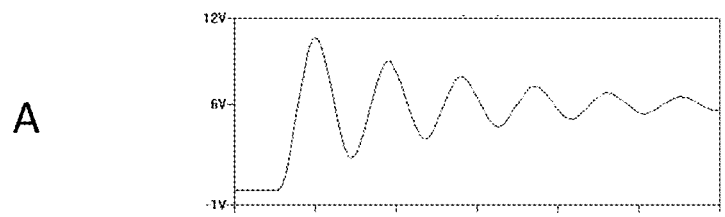
FIG. 19 shows plots illustrating three possible states of the gate drive waveform of the GaN transistor: A. an underdamped circuit waveform; B. an over-damped circuit waveform; and C. a critically damped circuit waveform.
Figure 19:
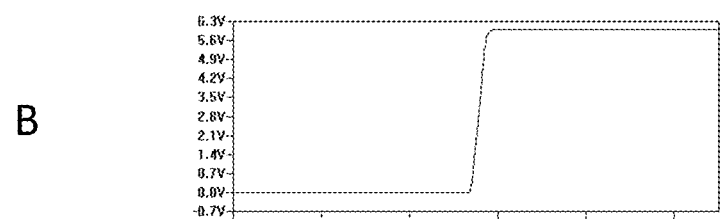
Figure 19:
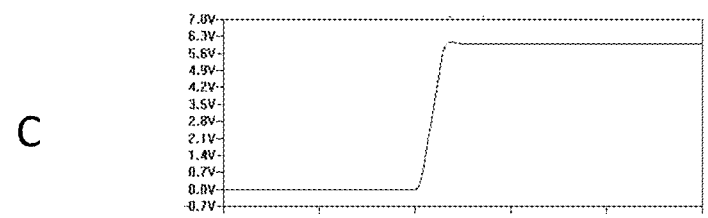

FIG. 19 shows examples of three possible states for a gate drive loop, depending on the R, L and C values of the gate drive loop, simulated for some typical gate drive scenarios.

For example, in a typical large-scale transistor, the respective values of R, L and C of a far away element may be 1Ω, 250 pF and 11500 pH, which results in an under-damped condition, e.g. as illustrated in FIG. 19, trace A.

When gate and gate return buses are properly coupled for flux cancellation as described herein, a magnetic field simulation shows the L value changes from 11500 pH to 115 pH. That is, the gate loop inductance is reduced by two orders of magnitude. This lower gate inductance changes the gate loop condition to a critically-damped and stable condition, e.g. as illustrated in FIG. 19, trace C. For comparison, FIG. 19, trace B shows an over-damped circuit waveform.

Simulations were run to investigate the effect on the inductance of the track widths of the gate and gate return buses and the spacing or separation between the gate and gate return buses. For the case where there was bus edge coincidence, i.e. the gate return bus runs directly over or under the gate bus, and the track widths of the gate and gate return buses are the same, there is a 20% decrease in inductance, relative to the case where the track width of the gate return bus is significantly wider than that of the gate bus. For an embedded type package, the gate inductance is reduced by 25 times when the underlying gate bus on the die was coupled with an overlying gate return bus on the embedded package, and the gap between buses, i.e. thickness of any intermetal dielectric layer(s) was 100 μm. When the gate and gate return buses are both on the die with a smaller separation of 5 μm, that inductance was further reduced by 4 times. These simulations indicate that reducing the gap or separation of the gate and gate return buses has a significant effect on reducing the gate loop inductance. Providing gate and gate return buses having the same track width provides further improvement, but has a more minor effect on reducing the gate loop inductance.

As mentioned above, parallel transistor cells in different parts of a large die may have intrinsically different on-resistances, e.g. due to imperfections caused by the fabrication process. These differences in resistances are more pronounced for a cold-started transistor than for a warmed-up transistor. Gate delay is mainly caused by the common source inductance Lcs. At turn-on, different currents in different cells leads to different voltage drops across Lcs, and hence different turn-on delays, depending on the load. Therefore, it is desirable that transistor cells share current equally during the rise time period. Minimizing turn-on delays between parallel cells is an effective way of protecting GaN transistors during the turn-on regime, preventing oscillations, without degrading device specifications. Inductance cancellation affects gate loop parameters in two ways. Firstly, equal current flows in each gate inductance and source sense inductance, which leads to flux cancellation and gate/source sense inductance cancellation. This effect may bring the gate RLC loop into an over-damped state, and consequently reduce ringing during the transistor turn-on times. Secondly, power loop current in the common source inductance adds negative voltage to the gate loop and consequently reduces the turn-on speed. Coupling between Lcs and part of the gate inductance induces forward current towards the gate and increases the turn-on speed. This induced current may cancel the delay caused by the Lcs voltage, but when it goes beyond that, it may cause instability due to increase of transistor gain.

Although an initial motivation for the device topology disclosed herein was to reduce the gate loop inductance to improve operational capabilities of large scale GaN power transistor switches through improved gate drive phase equalization and current balancing, results of these simulations suggest that maintaining operational parameters of the gate loop to be close to a critically damped and stable operational condition may be an unexpectedly important consideration. Without wishing to be limited by any particular theory, the scalable device topology for large scale lateral GaN power transistors disclosed herein applies flux cancellation to significantly reduce gate loop inductance, thereby potentially addressing issues of at least one of: gate drive phase equalization, current balancing, and maintaining operational parameters of the gate loop close to a critically damped state.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A lateral GaN (gallium nitride) power transistor comprising:
    a substrate comprising a device area of the transistor;
    a nitride semiconductor epitaxial layer stack formed on the device area of the substrate, the nitride semiconductor epitaxial layer stack comprising a GaN heterostructure defining active regions for a plurality of transistor islands of a multi-island transistor, each active region comprising a two-dimensional electron gas (2DEG) region; each transistor island comprising a source electrode and a drain electrode formed on a respective active region, and a gate electrode formed on a channel region between the source and drain electrodes;

the transistor being arranged as an array of transistor sections wherein each section comprises a set of the transistor islands;

at least a first layer and a second layer of conductive metallization defining an overlying interconnect structure comprising a drain bus, a source bus and a gate bus; the drain bus interconnecting drain electrodes of each section in parallel, the source bus connecting source electrodes of each section in parallel, and the gate bus connecting gate electrodes of each section in parallel;

the gate bus extending to a gate pad and the source bus extending to a gate return pad adjacent the gate pad, for connection of the gate pad and gate return pad to a gate drive voltage supply;

the gate bus and the source bus being provided by different layers of said at least first and second layers of conductive metallization, and conductive tracks of the source bus running directly over or under the conductive tracks of the gate bus and separated therefrom only by a layer or layers of intermetal dielectric, the gate bus and a gate return part of the source bus thereby forming a gate drive loop for each section of the transistor, wherein the gate bus and the source bus for each section of the transistor are inductively coupled for flux cancellation of the gate current and gate return current in the gate drive loop of each transistor section, and wherein parameters comprising: layout and routing of conductive tracks of the gate bus and the source bus; lateral dimensions comprising a track width of the gate bus and the source bus; and a thickness of the layer or layers of intermetal dielectric separating the gate bus and source bus; are configured to reduce the gate loop inductance for each section of the transistor.

2. The lateral GaN transistor of claim 1, wherein:

the drain bus has a first portion extending along a first edge of the device area and a plurality of second portions of the drain bus extending from the first portion between sections and interconnecting in parallel the drain electrodes of transistor islands of adjacent sections;

the source bus having a first portion extending along a second edge of the device area, and a plurality second portions extending from the first portion between sections of transistor islands and interconnecting in parallel the source electrodes of transistor islands of adjacent sections;

the second portions of the drain bus and second portions of the source bus alternating between adjacent pairs of sections;

the gate bus having a first portion extending along the second edge of the device area and a plurality of second portions extending from the first portion between sections of transistor islands and interconnecting in parallel the gate electrodes of transistor islands of adjacent sections.

3. The lateral GaN transistor of claim 2, wherein the sections are arranged as a linear array of a plurality of sections and wherein the gate pad and adjacent gate return pad are provided at one side of the array, and a second gate pad and adjacent gate return pad are provided at an opposite side of the array.

4. The lateral GaN transistor of claim 2, wherein the track widths of the conductive tracks of the gate bus and the source bus are substantially the same.

5. The lateral GaN transistor of claim 2, wherein the gate bus and the source bus are separated by a layer of intermetal dielectric having a thickness of 100 μm or less, whereby flux cancellation reduces the inductance of the gate drive loop for each transistor section by a factor of at least 25.

6. The lateral GaN transistor of claim 2, wherein the track widths of the conductive tracks of the gate bus and the source bus are substantially the same, and wherein the gate bus and the source bus are separated by a layer of intermetal dielectric having a thickness of ~5 μm or less, whereby flux cancellation reduces the inductance of the gate drive loop for each transistor section by a factor of about 100.

7. The lateral GaN transistor of claim 3 wherein the sections are arranged in an array comprising a repeating and scalable pattern of sections extending in at least one of first and second directions comprising rows and columns of sections.

8. The lateral GaN transistor of claim 2 wherein said parameters are configured to provide a gate loop inductance for each section of the transistor which maintains operational parameters of the gate loop close to a critically damped operational condition.

9. The lateral GaN transistor of claim 2, further comprising:

an overlying current redistribution structure comprising a low inductance metallization layer defining source conductive tracks formed directly on the source bus and drain conductive tracks formed directly on the drain bus, and a conductive pad on each of the gate and gate return pads;

the source conductive tracks and drain conductive tracks having lateral dimensions that substantially match lateral dimensions of the respective underlying source and drain buses.

10. The lateral GaN transistor of claim 9, wherein the lateral dimensions of the source conductive tracks and drain conductive tracks are no greater than the lateral dimensions of the respective underlying source and drain buses, so that the source conductive tracks and drain conductive tracks do not extend over active regions of the transistor islands.

11. The lateral GaN transistor of claim 9, wherein the low inductance metallization layer is patterned to match the lateral dimensions of the underlying source and drain buses.

12. The lateral GaN transistor of claim 9, wherein the lateral dimensions of the source conductive tracks and drain conductive tracks have a track width wider than the track width of the respective underlying source and drain buses, so that the source conductive tracks and drain conductive tracks extend partially over active regions of the transistor islands.

13. The lateral GaN transistor of claim 9, wherein the low inductance metallization layer has a thickness that is at least 5 to 10 times greater than the thickness of the on-chip metallization layer defining the underlying source and drain buses.

14. The lateral GaN transistor of claim 13, wherein the on-chip metallization layer defining the underlying source and drain buses has a thickness of about ~4 μm and the low inductance metallization layer has a thickness of about ~40 μm.

15. The lateral GaN transistor of claim 9, wherein the low inductance metallization layer comprises a copper redistribution layer.

16. The lateral GaN transistor of claim 9, wherein the low inductance metallization layer comprises a copper redistribution layer (RDL), and RDL layer has a track width that is substantially the same as a track width of the underlying source and drain buses, and the thickness of the RDL layer is at least several times greater than the thickness of the metallization layer defining the source and drain buses.

17. The lateral GaN transistor of claim 9, wherein the redistribution layer has a track width that is narrower than a track width of the underlying source and drain buses, and wherein the redistribution layer is formed within an opening in a die passivation layer which is narrower than the track width of the underlying source and drain buses.

18. A large area/high current lateral GaN transistor comprising a plurality of transistor islands forming a multi-island transistor, each island comprising a source, drain and gate electrode, and the multi-island transistor being arranged as an array of plurality of sections each section containing a sub-array of a set of said transistor islands; an overlying interconnect structure comprising at least one conductive metallization layer defining a drain bus, a source bus and a gate bus; the source, gate and drain buses extending between sections of the array and interconnecting in parallel the individual transistor islands of each section; and an overlying current redistribution structure, the current redistribution structure comprising a redistribution layer of low inductance metallization defining source conductive tracks formed directly on the source bus and drain conductive tracks formed directly on the drain bus, and a gate pad on the gate bus; the source conductive tracks and the drain conductive tracks being patterned to substantially match the lateral dimensions of the underlying source bus and drain bus.

19. The lateral GaN transistor of claim 18, wherein the redistribution layer has a thickness greater than a thickness of the underlying source bus and drain bus to provide a required current density.

20. The lateral GaN transistor of claim 18, wherein the redistribution layer has a track width that is narrower than a track width of the underlying source and drain buses, and wherein the redistribution layer is formed within an opening in a die passivation layer which is narrower than the track width of the underlying source and drain buses.

* * * * *